United States Patent
O'Brien et al.

(10) Patent No.: US 11,557,686 B2
(45) Date of Patent: Jan. 17, 2023

(54) QUANTUM DOT STRUCTURE HAVING A BARRIER REGION AND A TRAP REGION, RADIATION CONVERSION ELEMENT AND LIGHT-EMITTING DEVICE

(71) Applicant: OSRAM Opto Semiconductors GmbH, Regensburg (DE)

(72) Inventors: David O'Brien, Portland, OR (US); Joseph Treadway, Portland, OR (US)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 16/551,651

(22) Filed: Aug. 26, 2019

(65) Prior Publication Data
US 2021/0066522 A1    Mar. 4, 2021

(51) Int. Cl.
H01L 33/06 (2010.01)
H01L 33/50 (2010.01)
H01L 33/56 (2010.01)
H01L 31/0352 (2006.01)

(52) U.S. Cl.
CPC ...... *H01L 31/035218* (2013.01); *H01L 33/06* (2013.01); *H01L 33/502* (2013.01); *H01L 33/56* (2013.01); *C01P 2002/10* (2013.01)

(58) Field of Classification Search
CPC ... H01L 33/502–504; H01L 33/00–647; H01L 21/02601–02606; Y10S 977/774; Y10S 977/815–823; Y10S 977/813–826; Y10S 977/949–95; Y10S 977/952; C01P 2002/10
See application file for complete search history.

(56) References Cited

U.S. PATENT DOCUMENTS

| | | | |
|---|---|---|---|
| 2009/0230382 A1* | 9/2009 | Banin | C09K 11/02 257/14 |
| 2014/0224305 A1 | 8/2014 | Nagashima et al. | |
| 2016/0211409 A1 | 7/2016 | Kazama et al. | |
| 2017/0186985 A1* | 6/2017 | Kim | H01L 51/506 |
| 2018/0043022 A1* | 2/2018 | Nagpal | A61K 31/16 |
| 2019/0078017 A1* | 3/2019 | Kahen | C09K 11/025 |
| 2019/0229153 A1* | 7/2019 | Park | C09K 11/0883 |

FOREIGN PATENT DOCUMENTS

| | | |
|---|---|---|
| CN | 106566526 A | 4/2017 |
| KR | 101880510 B1 | 8/2018 |

OTHER PUBLICATIONS

"'Giant' Multishell CdSe Nanocrystal Quantum Dots with Suppressed Blinking", Y. Chen et al., J. Am. Chem. Soc. 2008, 130, 5026-5027 (Year: 2008).*

(Continued)

*Primary Examiner* — Kevin Parendo
(74) *Attorney, Agent, or Firm* — Slater Matsil, LLP

(57) ABSTRACT

A quantum dot structure, a radiation conversion element and a light emitting device are disclosed. In an embodiment a quantum dot structure includes an active region configured to emit radiation, a barrier region surrounding the active region and a trap region spaced apart from the active region, wherein a band edge of the trap region forms a trap configuration with respect to the barrier region for at least one type of charge carrier.

20 Claims, 4 Drawing Sheets

(56) References Cited

OTHER PUBLICATIONS

Bae W.K., et al., "Controlled Alloying of the Core—Shell Interface in CdSe/CdS Quantum Dots for Suppression of Auger Recombination," ACS Nano, vol. 7, No. 4, Mar. 23, 2013, pp. 3411-3419.
Garcia-Santamaria, F., et al., "Suppressed Auger Recombination in "Giant" Nanocrystals Boosts Optical Gain Performance," American Chemical Society 2009, Nano Letters, vol. 9, No. 10, pp. 3482-3488.

\* cited by examiner

QUANTUM DOT STRUCTURE HAVING A BARRIER REGION AND A TRAP REGION, RADIATION CONVERSION ELEMENT AND LIGHT-EMITTING DEVICE

TECHNICAL FIELD

The present application relates to a quantum dot structure, a radiation conversion element comprising a quantum dot structure and a light-emitting device.

BACKGROUND

Semiconductor quantum dots may be used for optical down conversion of radiation. However, at higher pump flux levels the conversion efficiency is limited.

SUMMARY

Embodiments provide a quantum dot structure that provides efficient conversion, in particular at high pump flux levels.

A quantum dot structure is specified. The term "quantum dot structure" broadly covers all structures where charge carriers experience a quantization of energy states due to confinement. In particular, the quantization occurs along two or three directions that are mutually perpendicular to one another.

According to at least one embodiment of the quantum dot structure, the quantum dot structure comprises an active region configured to emit radiation.

The quantum confinement effect enables tuning of the emission wavelength of the radiation emitted by the quantum dot structure by the size of the active region. In particular a maximum extent of the active region is so small that quantization of energy states occurs. For instance the maximum of extent of the active region is between 1 nm and 15 nm. The active region may have an essentially circular or elliptical cross-section. The quantum dot structure is in particular configured to emit radiation in the infrared, visible or ultraviolet spectral range.

According to at least one embodiment of the quantum dot structure, the quantum dot structure comprises a barrier region. The barrier region in particular surrounds the active region. The barrier region in particular is configured to absorb a primary radiation which is to be converted into the radiation to be emitted by the active region. The barrier region may comprise two or more subregions. For instance, one subregion or more than one subregions or all subregions may be configured to absorb the primary radiation.

For instance a band gap of the barrier region is larger than a band gap of the active region. Charge carriers, for instance electrons and holes, may be localized in the active region.

According to at least one embodiment of the quantum dot structure, the quantum dot structure comprises a trap region. The trap region is spaced apart from the active region. This means that the trap region does not directly adjoin the active region.

According to at least one embodiment of the quantum dot structure, a band edge of the trap region forms a trap configuration with respect to the barrier region for at least one type of charge carriers. This means that either electrons or holes or both electrons and holes may be trapped by the trap region.

According to at least one embodiment of the quantum dot structure, a conduction band edge of the trap region is lower than a conduction band edge of a material of the barrier region adjoining the trap region and/or a valence band edge of the trap region is higher than a valence band edge of a material of the barrier region adjoining the trap region.

For instance, the conduction band edge of the trap region is at least 50 meV or at least 100 meV or at least 200 meV lower than the conduction band edge of adjoining material. Alternatively or in addition, the valence band edge of the trap region may be at least 50 meV or at least 100 meV or at least 200 meV higher than the valence band edge of adjoining material.

For instance a material of the barrier region adjoining the trap region has a band gap that is larger than a band gap of the trap region.

For instance, the band gap of the trap region is at least 50 meV or at least 100 meV or at least 200 meV smaller than the band gap of adjoining material.

For instance, the band gap of the trap region is at most 1000 meV or at most 800 meV or at most 500 meV smaller than the band gap of adjoining material.

The trap region may be embedded in the barrier region or be arranged on a side of the barrier region facing away from the active region.

According to at least one embodiment of the quantum dot structure, the trap region is arranged between the active region and a surface of the quantum dot structure.

Thus, the trap region insulates the quantum dot structure from the outer environment.

According to at least one embodiment of the quantum dot structure, the active region is arranged between the trap region and a surface of the quantum dot structure. For instance, the trap region is the innermost region of the quantum dot structure. In this configuration the volume of the trap layer is comparably small, in particular compared to the case where the trap layer is close to the surface of the quantum dot structure. This reduces the risk of direct absorption of light to be converted by the active region within the trap layer.

Along a radial direction the extent of the trap region is in particular so small that quantization effects occur in the trap region.

In at least one embodiment of the quantum dot structure, the quantum dot structure comprises an active region configured to emit a radiation, a barrier region surrounding the active region and a trap region spaced apart from the active region, wherein a band edge of the trap region forms a trap configuration with respect to the barrier region for at least one type of charge carriers.

It has been found that multi-carrier Auger processes in the active region or near the active region may result in so-called hot carriers having a large energy. In absence of the trap region these hot carriers could easily travel to the surface of the quantum dot structure and participate there in photoionization or photooxidation processes at that interface. Due to the extremely small nature of quantum dots such effects at the surface have a large effect on the quantum dots performance and lead to degradation of the quantum dot structure and optical performance. By means of the trap region the hot carriers may be trapped and thus be prevented from reaching the surface of the quantum dot structure.

It has been found that the hot carriers can be efficiently captured using the trap region. Consequently, these trapped carriers do not participate in detrimental photoionization at the surface of the quantum dot structure.

The distance between the active region and the trap region may be comparably large. This helps to reduce the risk that the trap region quenches the excitation. In particular, the distance may be so large that the material between the active region and the trap region substantially has properties of bulk material. For instance, the distance between the active region and the trap region is at least 10 nm or at least 20 nm or at least 50 nm.

According to at least one embodiment of the quantum dot structure the quantum dot structure has a core-shell configuration. In particular the core may represent the active region and the barrier region may represent the shell. For instance the active region is the innermost region of the quantum dot structure.

According to at least one embodiment of the quantum dot structure the trap region is arranged between material having a larger band gap than the trap region. This means that on both sides of the trap region material having a larger band gap than the trap region is provided.

According to at least one embodiment of the quantum dot structure the band gap of the trap region is larger than the band gap of the active region. For instance the band gap of the trap region is larger than a ground state transition energy of the active region. This transition energy corresponds to the energy of the radiation emitted by the active region.

The ground state transition energy corresponds to the energy difference between the ground state of the conduction band and the associated ground state in the valence band.

According to at least one embodiment of the quantum dot structure a ground state transition energy in the active region is smaller than a ground state transition energy in the trap region. Consequently the trap region does not absorb the radiation emitted by the active region.

According to at least one embodiment of the quantum dot structure, the conduction band edge of the barrier region gradually increases toward the trap region and/or the valence band edge of the barrier region gradually decreases toward the trap region. For instance, a band gap of the barrier region gradually increases toward the trap region, for example, through gradient alloying of the barrier and trap materials.

In particular the barrier region may be configured such that a charge carrier is more likely to escape from the trap region in a direction toward the active region than in a direction facing away from the active region. In other words the probability for electrons and/or holes to tunnel through the barrier region to the active region is increased. Consequently the barrier region provides a pathway that allows them to return to the active region and participate there in radiative transition, thereby improving the conversion efficiency of the quantum dot structure.

According to at least one embodiment a conduction band edge of material adjoining the trap region on a side of the trap region facing the active region is lower than a conduction band edge of material adjoining the trap region on a side of the trap region facing away from the active region and/or a valence band edge of material adjoining the trap region on a side of the trap region facing the active region is higher than a valence band edge of material adjoining the trap region on a side of the trap region facing away from the active region.

For example, a band gap of material adjoining the trap region on a side of the trap region facing the active region is lower than a band gap of material adjoining the trap region on a side of the trap region facing away from the active region.

For instance, the band gap of material adjoining the trap region on the side of the trap region facing the active region is at least 50 meV or at least 100 meV lower than the band gap of material adjoining the trap region on the side of the trap region facing away from the active region.

In particular, the electronic barrier for charge carriers in the trap region is lowered in a direction towards the active region compared to the energy required to remove the charge carriers to the surface of the quantum dot structure.

According to at least one embodiment of the quantum dot structure, a band gap of the barrier region is larger than the band gap of the trap region all over the barrier region. In this case the trap region and the active region may be the only regions within the quantum dot structure that have a smaller band gap than the barrier region.

According to at least one embodiment of the quantum dot structure, the trap region comprises discrete energy levels. In particular these discrete energy levels occur due to quantum confinement effects.

According to at least one embodiment of the quantum dot structure, the barrier region is configured to absorb a primary radiation and the discrete energy levels of the trap region are configured such that transition energies between the discrete energy levels do not correspond to an energy of the primary radiation. In other words the trap region is configured such that it does not absorb the primary radiation to be converted by the quantum dot structure into the secondary radiation to be emitted by the active region. This increases the probability for charge carriers produced by absorption of primary radiation to reach the active region and recombine there with the emission of radiation.

According to at least one embodiment of the quantum dot structure, the quantum dot structure comprises a III-V-compound semiconductor material. For instance the quantum dot structure comprises InN, GaN, InP, GaP, AlP, InAs or GaAs and/or a ternary or quaternary material made from these compound semiconductors. Using these materials efficient emission of radiation in the infrared, visible or ultraviolet spectral range can be obtained.

According to at least one embodiment of the quantum dot structure, the quantum dot structure comprises a II-VI-compound semiconductor material. For instance, the quantum dot structure, in particular the barrier region, the active region and/or the trap region comprises CdS, CdSe, CdTe, ZnO, ZnS, ZnSe or ZnTe or ternary or quaternary materials made from these compound semiconductor materials.

A radiation conversion element may comprise one or more of the above quantum dot structures. In particular the radiation conversion element comprises a plurality of quantum dot structures. For example, the quantum dot structures are embedded in a matrix material such as a silicone material or an epoxy material. Alternatively the quantum dot structures may form a ceramic, for instance together with additives.

Furthermore, a light-emitting device is specified. The light-emitting device in particular comprises a radiation conversion element having at least one of the above features and a semiconductor chip configured to emit a primary radiation. For instance the quantum dot structure absorbs at least part of the primary radiation and the active region emits a secondary radiation having a larger peak wavelength than the primary radiation. For instance the light-emitting device is configured to emit overall a mixed light, for example, mixed light that appears white to the human eye.

According to at least one embodiment of the light-emitting device, the trap region does not absorb the primary radiation. Consequently the trap region may efficiently capture hot electrons produced due to Auger interactions with no, or at least no significant, absorption of the primary radiation which could negatively affect the conversion efficiency of the quantum dot structure and thus of the light-emitting device.

BRIEF DESCRIPTION OF THE DRAWINGS

Further embodiments and developments of the quantum dot structure, the radiation conversion element and the light-emitting device will become apparent form the exemplary embodiments described below in association with the figures.

In the figures.

In the exemplary embodiments and figures similar or similarly acting constituent parts are provided with the same reference symbols.

The elements illustrated in the figures and their size relationships among one another should not be regarded as true to scale. Rather, individual elements or layer thicknesses may be represented with an exaggerated size for the sake of better representability and/or for the sake of better understanding.

DETAILED DESCRIPTION OF ILLUSTRATIVE EMBODIMENTS

Figure 1:
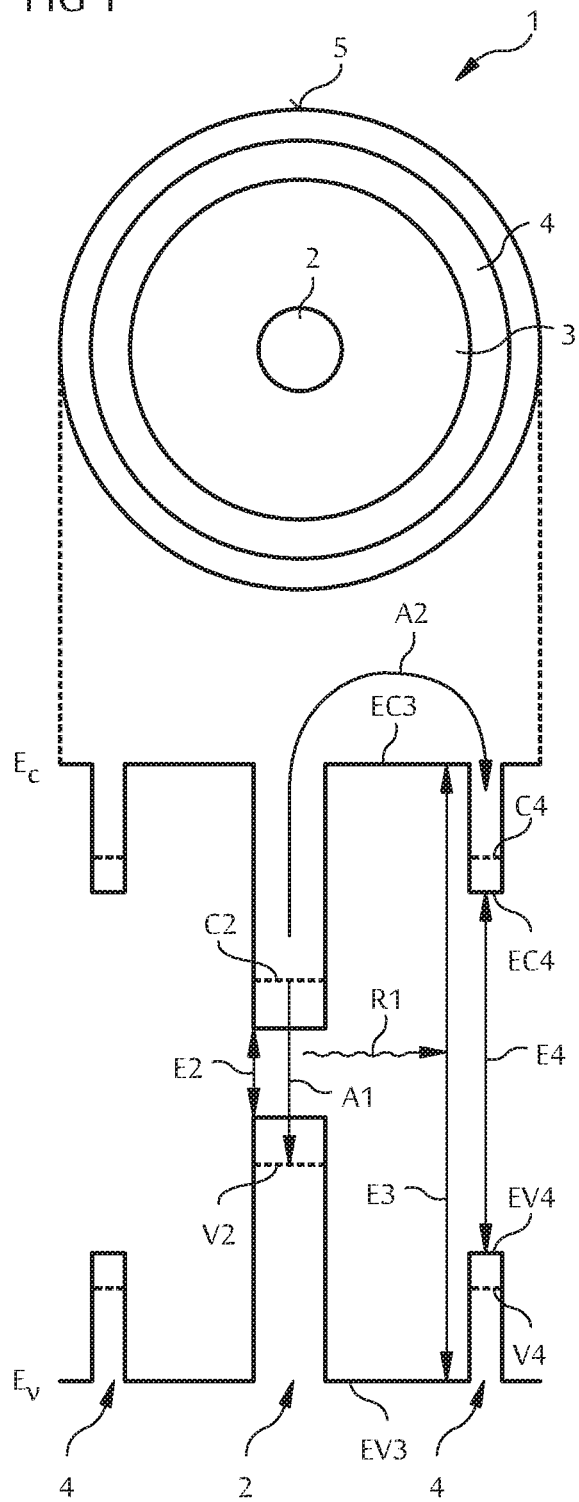
FIG. 1 shows an exemplary embodiment of a quantum dot structure in sectional view with an associated band diagram.

In FIG. 1 an exemplary embodiment of a quantum dot structure 1 is illustrated schematically. The quantum dot structure 1 comprises an active region 2 configured to emit a radiation R1. A barrier region 3 directly adjoins the active region 2. In particular the barrier region surrounds the active region. The quantum dot structure 1 further comprises a trap region arranged between the active region 2 and a surface 5 of the quantum dot structure 1.

The figure further schematically illustrates the associated band structure with conduction band $E_C$ and valence band $E_V$.

A conduction band edge EC4 of the trap region 4 is energetically lower than a conduction band edge EC3 of a material of the barrier region 3 adjoining the trap region, so that the trap region forms a trap configuration for electrons.

Furthermore, a valence band edge EV4 of the trap region is higher than a valence band edge EV3 of a material of the barrier region adjoining the trap region, so that the trap region forms a trap configuration for electrons.

This may be obtained by using a material for the trap region 4 that has a larger band gap than the adjoining material.

However, the band configuration may also be selected such that a trap configuration only occurs for one type of charge carriers, i.e., for electrons or holes. This applies for all exemplary embodiments.

A band gap E3 of the barrier region 3 is larger than a band gap E2 of the active region 2. A band gap E4 of the trap region is smaller than the band gap E3 of material of the barrier region 3 directly adjoining the trap region.

The barrier region 3 is configured to absorb a primary radiation. The charge carriers produced during absorption reach the active region 2 and recombine there with emission of radiation R1. The energy of the radiation R1 corresponds to the transition energy between ground state C2 of the conduction band $E_C$ and ground state V2 of the valence band $E_V$. The recombination is illustrated using arrow A1.

The trap region 4 also has discrete energy levels due to quantization. The transition energy between the ground state C4 of the conduction band and the ground state V4 of the valence band is greater than the energy of the radiation R1 generated in the active region 2 so that the trap region 4 does not absorb the radiation R1.

Hot carriers produced by Auger interactions may be trapped by trap region 4. This is illustrated by arrow A2. Thus the trap region 4 prevents the charge carriers from reaching the surface 5 of the quantum dot structure 1. This helps to avoid or at least to reduce the charge carriers from causing damage at the surface of the quantum dot structure, especially irreversible damage that results in low energy or "deep trap" states that become dark (non-luminescent) deactivation pathways for subsequent excitations at the quantum dot structure. The captured carriers may recombine in the trap region or tunnel from the trap region into the active region.

In the exemplary embodiment shown, the quantum dot structure 1 has a core-shell configuration with the active region 2 representing the core and the barrier region 3 together with the trap region 4 representing the shell. The trap region 4 is arranged between the active region 2 and the surface 5. However, the trap region 4 may be also be used for other quantum dot structures.

Preferably, a distance between the trap region 4 and the active region 2 is so large that the intervening material substantially has bulk material properties.

The trap region 4 is arranged comparably close to the surface 5 of the quantum dot structure. For instance a distance between the active region and the trap region is at least twice as large as a distance between the trap region and the surface 5.

The trap region 4 is configured such that the discrete energy levels thereof do not result in transition energies corresponding to the energy of the primary radiation to be absorbed. Thus, unintended absorption of the primary radiation in the trap region 4 is avoided. The absorption of the primary radiation predominantly occurs in the barrier region 3, in particular outside of the trap region 4.

For instance the entire material arranged within the surface 5 is semiconductor material. The active region, the barrier region and/or the trap region may comprise a III-V semiconductor compound material or a II-VI semiconductor compound material, for instance one or more of the semiconductor materials mentioned above.

By way of example, the quantum dot structure 1 has a circular cross-section. However, other geometries may also apply.

The barrier region 3 may have a structure with a plurality of subregions. These subregions are not explicitly shown in order to facilitate representation. For instance a subregion comprising or consisting of CdS and a subregion comprising or consisting of ZnS of the barrier region 3 may be arranged between the active region 2 and the trap region 4.

The trap region 4 may comprise or consist of ZnO, for instance.

In particular a material sequence of CdSe/CdS/ZnS/ZnO/ZnS may apply when seen from the center of the quantum dot structure toward its surface. In this case, CdSe forms the active region 2 and ZnO the trap region 4.

Figure 2:
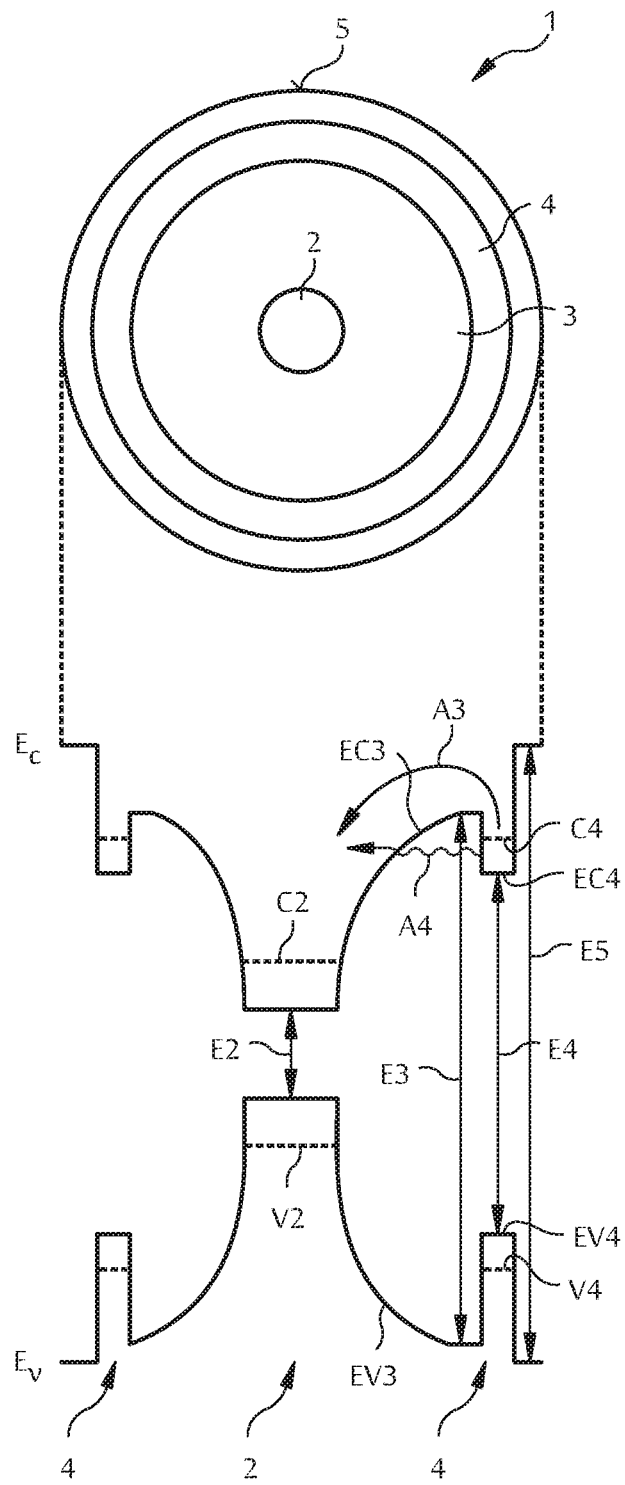
FIG. 2 shows an exemplary embodiment of a quantum dot structure in sectional view with an associated band diagram.

In FIG. 2 a further exemplary embodiment of a quantum dot structure is illustrated. This exemplary embodiment essentially corresponds to that described in connection with FIG. 1.

Unlike in FIG. 1, the barrier region 3 has a band gap that gradually increases toward the trap region 4. The band gap of the material of the barrier region 3 directly adjoining the trap region 4 is larger than the band gap of the trap region 4.

However, the energy difference between the trap region 4 and the barrier region 3 is reduced at a side of the trap region facing the quantum structure 2 compared to the barrier at the side of the trap region facing away from the active region 2. The band gap E5 of material arranged on the side of the trap region facing away from the active region is larger than the band gap E3 of the barrier region adjoining the trap region 4 on the side facing toward the active region 2.

Consequently, the tunnelling probability of electrons located in the ground state C4 of the trap region 4 through the barrier region 3 toward the active region 2 is increased. This is shown in FIG. 2 for the electrons by way of arrow A4. Another pathway to the active region 2 due to thermal activation is illustrated by arrow A3.

Using the graded structure of the barrier region 3, the fraction of charge carriers that are trapped by the trap region 4 and subsequently participate in a radiative recombination process in the active region 2 is increased, resulting in a further increase of the performance of the quantum dot structure.

Furthermore, the graded structure may, in particular with appropriately chosen materials and lattice constants, help to reduce the strain in the quantum dot structure, in particular in the shell. Thus, crystal defects and trap states may be reduced so that the overall performance of the quantum structure may be improved further.

Figure 3:
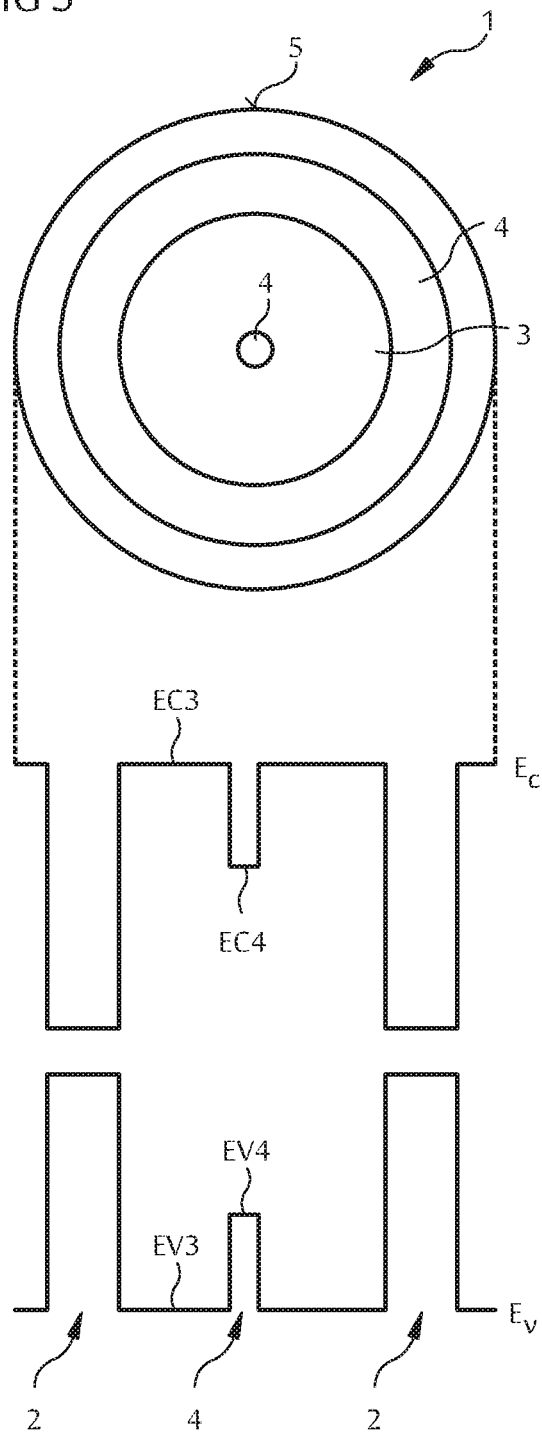
FIG. 3 shows an exemplary embodiment of a quantum dot structure in sectional view with an associated band diagram.

The exemplary embodiment shown in FIG. 3 essentially corresponds to that described in connection with FIG. 1. Unlike in FIG. 1, the trap region 4 is surrounded by the active region 2. The active region 2 is arranged between the surface 5 and the trap region 4. The volume of the trap region 4 is reduced compared to a configuration, where the trap region is arranged close to the surface of the quantum dot structure as the volume of the trap layer scales with r3, where r is the radius of the trap region. This reduces unintended direct absorption of incident light. The trap region 4 may be the innermost region of the quantum dot structure 1. As described in connection with FIG. 1, the charge carriers trapped by the trap region 4 do not reach the surface 5.

This arrangement of the trap region 4 relative to the active region 2 may also apply for the embodiment described in connection with FIG. 2.

Figure 4:
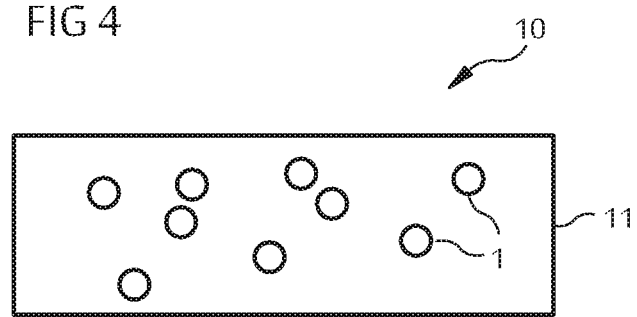
FIG. 4 shows an exemplary embodiment of a radiation conversion element.

An exemplary embodiment of a radiation conversion element including a quantum dot structure is shown in FIG. 4. The radiation conversion element 10 comprises a plurality of quantum dot structures which may be configured as described in connection with FIGS. 1, 2 and 3, for instance. For example, the radiation conversion elements are embedded in a matrix material 11 such as a silicone or an epoxy material.

Alternatively the quantum dot structures may form a ceramic that represents the radiation conversion element.

Figure 5:
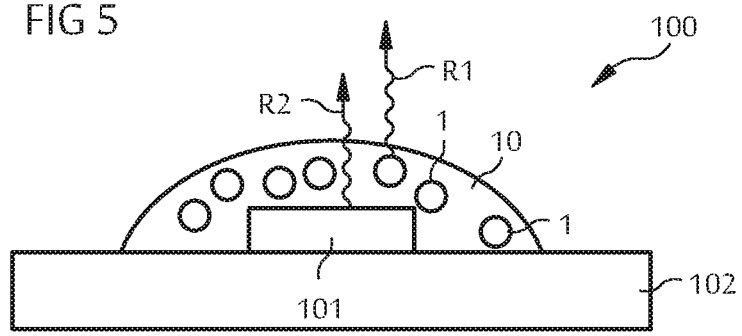
FIG. 5 shows an exemplary embodiment of a light-emitting device.

An exemplary embodiment of a light-emitting device is illustrated in FIG. 5. The light-emitting device 100 comprises a semiconductor chip 101 arranged on a carrier 102, for instance a substrate, a housing or a lead frame. The semiconductor chip 101 is configured to emit a primary radiation R2 illustrated by an arrow in FIG. 4.

The light-emitting device 100 further comprises a plurality of quantum dot structures 1 arranged in a radiation conversion element 10. The radiation conversion elements further acts as an encapsulation of the semiconductor chip 101. However, the radiation conversion element may also be a prefabricated element as shown in FIG. 4. The quantum dot structure 1 absorbs at least part of the primary radiation R2 and emits radiation R1 as secondary radiation having a larger wavelength than the primary radiation R2.

For instance the primary radiation is in the blue spectral range and the secondary radiation in the yellow spectral range so that the light-emitting device overall emits mixed light that appears white to the human eye, for instance.

As described in connection with FIGS. 1, 2, and 3 the trap region of the quantum dot structure 1 does not absorb the primary radiation. Consequently the trap region helps to reduce or avoid a negative impact of hot charge carriers reaching the surface of the quantum dot structure. At the same time, absorption losses caused by the trap region may be prevented.

Thus even at a high flux of the primary radiation an efficient radiation conversion into secondary radiation may be obtained.

Therefore the quantum dot structure is particularly suitable for light-emitting devices configured to provide high flux, for instance high flux white light.

REFERENCES 1 quantum dot structure
2 active region
3 barrier region
4 trap region
5 surface
10 radiation conversion element
11 matrix material
100 light-emitting device
101 semiconductor chip
102 carrier
A1 arrow
A2 arrow
A3 arrow
A4 arrow
C2 ground state of conduction band in active region
C4 ground state of conduction band in trap region
E2 band gap of active region
E3 band gap of barrier region
E4 band gap of trap region
E5 band gap of material adjoining trap region
EC3 conduction band edge of barrier region
EC4 conduction band edge of trap region
EV3 valence band edge of barrier region
EV4 valence band edge of barrier region
V3 ground state of valence band of active region
V4 ground state of valence band of trap region
R1 radiation
R2 primary radiation

What is claimed is:

1. A quantum dot structure comprising:
an active region configured to emit radiation;
a barrier region surrounding the active region; and
a trap region spaced apart from the active region,
wherein, on both sides of the trap region, the trap region directly adjoins a material that has a larger band gap than the trap region,
wherein a band edge of the trap region forms a trap configuration with respect to the barrier region for at least one type of charge carrier,
wherein a distance between the active region and the trap region is at least 10 nm, wherein the barrier region is thicker than the trap region, and wherein a conduction band edge of the barrier region continuously increases from the active region to the trap region and/or a valence band edge of the barrier region continuously decreases from the active region to the trap region.

2. The quantum dot structure according to claim 1, wherein a conduction band edge of the trap region is lower than a conduction band edge of a material of the barrier region adjoining the trap region and/or a valence band edge of the trap region is higher than a valence band edge of a material of the barrier region adjoining the trap region.

3. The quantum dot structure according to claim 1, wherein the quantum dot structure has a core-shell configuration.

4. The quantum dot structure according to claim 1, wherein a band gap of the trap region is larger than a band gap of the active region.

5. The quantum dot structure according to claim 1, wherein a ground state transition energy in the active region is smaller than a ground state transition energy in the trap region.

6. The quantum dot structure according to claim 1, wherein a conduction band edge of a material adjoining the trap region on a side of the trap region facing the active region is lower than a conduction band edge of a material adjoining the trap region on a side of the trap region facing away from the active region and/or a valence band edge of a material adjoining the trap region on a side of the trap region facing the active region is higher than a valence band edge of a material adjoining the trap region on a side of the trap region facing away from the active region.

7. The quantum dot structure according to claim 1, wherein a band gap of the barrier region is larger than a band gap of the trap region all over the barrier region.

8. The quantum dot structure according to claim 1, wherein the trap region comprises discrete energy levels.

9. The quantum dot structure according to claim 8, wherein the barrier region is configured to absorb a primary radiation, and wherein the discrete energy levels are configured such that transition energies between the discrete energy levels do not correspond to energy of the primary radiation.

10. The quantum dot structure according to claim 1, wherein the quantum dot structure comprises a III-V- compound semiconductor material.

11. The quantum dot structure according to claim 1, wherein the quantum dot structure comprises a II-VI- compound semiconductor material.

12. The quantum dot structure according to claim 1, wherein the trap region is arranged between the active region and a surface of the quantum dot structure.

13. The quantum dot structure according to claim 1, wherein the active region is arranged between the trap region and a surface of the quantum dot structure.

14. A radiation conversion element comprising:
a plurality of quantum dot structures according to claim 1.

15. A light emitting device comprising:
the radiation conversion element according to claim 14; and
a semiconductor chip configured to emit a primary radiation,
wherein the quantum dot structures are configured to absorb at least part of the primary radiation, and
wherein the active region is configured to emit the radiation having a larger peak wavelength than the primary radiation.

16. The light emitting device according to claim 15, wherein the trap region is not configured to absorb the primary radiation.

17. The quantum dot structure according to claim 1, wherein the distance between the active region and the trap region is at least twice as large as a distance between the trap region and a surface of the quantum dot structure.

18. The quantum dot structure according to claim 17, wherein the trap region is arranged between the active region and the surface of the quantum dot structure.

19. The quantum dot structure according to claim 17, wherein the active region is arranged between the trap region and the surface of the quantum dot structure.

20. The quantum dot structure according to claim 1, wherein the barrier region is at least twice as thick as the trap region.

* * * * *